(12) United States Patent
Selinder et al.

(10) Patent No.: US 8,206,812 B2
(45) Date of Patent: *Jun. 26, 2012

(54) COATED CUTTING TOOL

(75) Inventors: Torbjörn Selinder, Stockholm (SE);
Mats Ahlgren, Täby (SE)

(73) Assignee: Sandvik Intellectual Property AB,
Sandviken (SE)

( * ) Notice: Subject to any disclaimer, the term of this patent is extended or adjusted under 35 U.S.C. 154(b) by 960 days.

This patent is subject to a terminal disclaimer.

(21) Appl. No.: 11/987,958

(22) Filed: Dec. 6, 2007

(65) Prior Publication Data

US 2008/0152882 A1    Jun. 26, 2008

(30) Foreign Application Priority Data

Dec. 15, 2006   (SE) ...................................... 0602747
Mar. 28, 2007   (SE) ...................................... 0700800

(51) Int. Cl.
*B32B 9/00*   (2006.01)

(52) U.S. Cl. ............ 428/216; 51/307; 51/309; 428/336; 428/697; 428/698; 428/699

(58) Field of Classification Search ..................... 51/307, 51/309; 428/216, 336, 697, 698, 699
See application file for complete search history.

(56) References Cited

U.S. PATENT DOCUMENTS 5,580,653 A  *  12/1996  Tanaka et al. ................. 428/336

(Continued)

FOREIGN PATENT DOCUMENTS

EP    0 592 986    4/1994

(Continued)

OTHER PUBLICATIONS

Hsieh et al "Deposition and characterization of TiAlN and multi-layered TiN/TiAlN coatings using unbalanced magnetron sputtering" Surf. and Coat. Tech. 108-109 (1998) p. 132-137.*

(Continued)

*Primary Examiner* — Archene Turner
(74) *Attorney, Agent, or Firm* — Morgan, Lewis & Bockius LLP

(57) ABSTRACT

The present invention relates to a coated cutting tool for metal machining with a from about 2.0 to about 20 μm thick PVD coating, having both the wear resistance of a coating of homogeneous layers and the toughness of a multilayer coating, comprising a first $(Me_{c1},Me_{c2})(C,N,O)$ layer where $Me_{c1}$ is one or more of the elements in the transition metal group IV-VI, Al and Si and $Me_{c2}$ is one of the elements in the transition metal group IV-VI from about 1.0 to about 4.5 μm thick, a second $(Me_{d1},Me_{d2})(C,N)$ layer where $Me_{d1}$ is one or more of the elements in the transition metal group IV-VI, Al and Si and $Me_{d2}$ is one of the elements in the transition metal group IV-VI and Y, from about 0.5 to about 4.5 μm thick, and in between the first and the second layer, an $(Me_{e1}, Me_{e2})(C, N,O)$ layer where $Me_{e1}$ is one or more of the elements in the transition metal group IV-VI, Al and Si and $Me_{e2}$ is one of the elements in the transition metal group IV-VI and Y, from about 0.1 to about 1.0 μm thick, where the thickness of the in between layer is less than about 0.5 times the thickness of thinnest of the first and the second layer and the layers in between has a composition differing from the first and the second layer, and a method of making thereof.

20 Claims, 1 Drawing Sheet

U.S. PATENT DOCUMENTS

| | | | |
|---|---|---|---|
| 6,077,596 A * | 6/2000 | Hashimoto et al. | 428/697 |
| 6,395,379 B1 * | 5/2002 | Braendle | 428/216 |
| 6,586,122 B2 * | 7/2003 | Ishikawa et al. | 428/697 |
| 6,737,178 B2 * | 5/2004 | Ota et al. | 51/307 |
| 7,060,345 B2 * | 6/2006 | Fukui et al. | 428/699 |
| RE39,814 E * | 9/2007 | Lindholm et al. | 428/699 |
| 7,294,416 B2 * | 11/2007 | Yamamoto et al. | 428/698 |
| 2006/0222893 A1 | 10/2006 | Derflinger | |

FOREIGN PATENT DOCUMENTS

| | | |
|---|---|---|
| EP | 0 701 982 | 3/1996 |
| EP | 0 890 406 | 1/1999 |
| EP | 0 983 393 | 11/2003 |
| EP | 1 473 385 A1 | 11/2004 |
| JP | 10-76408 A | 3/1989 |
| JP | 08-118106 * | 5/1996 |
| JP | 2003/025110 | 1/2003 |
| JP | 2004-345078 | 12/2004 |
| JP | 2006-181706 | 7/2006 |
| WO | 2006/084404 | 8/2006 |

OTHER PUBLICATIONS

Anderson et al "Depostion, microstructure and mechanical and tribological properties of magnetron sputtered TiN/TiAlN multilayers" Surf. and Coat. Techn. 123 (2000) p. 219-226.*

I. C. Noyan, et al., *Residual Stress Measurement by Diffraction and Interpretation*, New York: Springer-Verlag (1987) pp. 117-130.

* cited by examiner

COATED CUTTING TOOL

BACKGROUND OF THE INVENTION

The present invention relates to a coated cutting tool for metal machining, such as an insert for use in holding systems for turning, milling or drilling, or a solid tool, for instance, a drill or an endmill, having a body of cemented carbide or cermet, and a refractory coating, which entails excellent wear resistance of the tool, as well as toughness and resistance against edge chipping.

In the metal cutting industry there is a constant striving to increase productivity with demands on higher cutting speeds and feeds combined with increased tool life. To meet these demands, tool material development is largely focused on improving tool toughness and wear resistance.

By depositing a wear resistant coating by means of Physical Vapor Deposition, PVD, or Chemical Vapor Deposition, CVD, techniques the wear resistance can be dramatically improved compared to an uncoated tool.

Important improvements to coated cutting tools have been achieved by applying coatings of optimized thicker homogeneous PVD layers. However, with an increasing layer thickness, the positive effect on wear resistance is outbalanced by an increasing negative effect in the form of an increased risk of coating delamination and reduced toughness, making the cutting tool less reliable.

The tool generally has at least one cutting edge where the chip is separated from the work piece. The cutting edge separates two faces of the tool; a rake face, and a clearance face. This cutting edge is often subjected to chipping problems or fracture. This may happen as the result of a crack in the coating which may be present in the as coated tool or introduced as a result of, e.g., an intermittent cutting process.

The resistance to fracture or chipping is what is experienced as tool toughness, and this may be affected by the selection of coating and controlling its microstructure.

Examples of controlled microstructures are laminar superlattice coatings of multicomponent composition, for instance periodic TiN+VN, TiN+NbN or TiN+AlN thin layered structures, as disclosed, e.g., in EP 0 701 982 and EP 0 592 986.

EP 0 983 393 discloses aperiodic multilayer coatings of alternating metal nitrides or carbide layers where the multilayered microstructure provides for increased coating toughness compared to homogeneous coatings.

Albeit enhanced coating toughness, one of the most common failure modes of coated tools is related to fracture and chipping of the cutting edge.

OBJECTS AND SUMMARY OF THE INVENTION

It is an object of the present invention to provide a coated cutting tool having both the wear resistance of a coating of homogeneous layers and, the toughness of a multilayer coating.

It is a further object of the present invention to provide a coated cutting tool with a larger coating thickness than what was previously attainable, thereby further augmenting the wear resistance without reducing the tool toughness.

In one embodiment of the invention, there is provided a coated cutting tool for metal machining comprising a body of cemented carbide or cermet onto which is applied a PVD coating wherein said coating has a thickness of from about 2.0 to about 20 μm, and comprises: a first $(Me_{c1},Me_{c2})(C,N,O)$ layer, c, where one or more of the elements C, N and O are present, $Me_{c1}$ and $Me_{c2}$ being different elements, and where $Me_{c1}$ is one or more of the elements in the transition metal group IV-VI, Al and Si and $Me_{c2}$ is one of the elements in the transition metal group IV-VI and Y having a thickness of from about 1.0 to about 4.5 μm, a second $(Me_{d1},Me_{d2})(C,N)$ layer, d, where one or more of the elements C and N are present, $Me_{d1}$ and $Me_{d2}$ being different elements, and where $Me_{d1}$ is one or more of the elements in the transition metal group IV-VI, Al and Si and $Me_{d2}$ is one of the elements in the transition metal group IV-VI and Y having a thickness of from about 0.5 to about 4.5 μm and in between the first layer, c, and the second layer, d, an $(Me_{e1}, Me_{e2})(C,N,O)$ layer, e, where $Me_{e1}$ is optionally present and one or more of the elements C, N and O are present, $Me_{e1}$ and $Me_{e2}$ are different elements, the atomic fraction of $Me_{e1}$ to $Me_{e2}$ is 0 to about 0.3 and where $Me_{e1}$ is one or more of the elements in the transition metal group IV-VI, Al and Si and $Me_{e2}$ is one of the elements in the transition metal group IV-VI and Y having a thickness of from about 0.1 to about 1.0 μm, where the thickness of the layer between the first layer, c, and second layers, d, is less than about 0.5 times the thickness of thinnest of the first layer, c, and the second layer, d, and where the layer, e, between the first layer, c, and second layer, d, has a composition differing from the first layer, c, and the second layer, d.

In another embodiment of the invention, there is provided a method of making a coated cutting tool comprising providing a body of cemented carbide or cermet onto which is deposited, by PVD technique as known in the art, a hard and wear resistant from about 2.0 to about 20 μm thick coating comprising: a first $(Me_{c1},Me_{c2})(C,N,O)$ layer, c, where one or more of the elements C, N and O are present, $Me_{c1}$ and $Me_{c2}$ being different elements, and where $Me_{c1}$ is one or more of the elements in the transition metal group IV-VI, Al and Si and $Me_{c2}$ is one of the elements in the transition metal group IV-VI and Y having a thickness of from about 1.0 to about 4.5 μm, a second $(Me_{d1},Me_{d2})(C,N)$ layer, d, where one or more of the elements C and N are present, $Me_{d1}$ and $Me_{d2}$ being different elements, and where $Me_{d1}$ is one or more of the elements in the transition metal group IV-VI, Al and Si, and $Me_{c2}$ is one of the elements in the transition metal group IV-VI and Y, having a thickness of from about 0.5 to about 4.5 μm, in between the first layer, c, and the second layer, d, an $(Me_{e1}, Me_{e2})(C,N,O)$ layer, e, where $Me_{e1}$ is optionally present, and one or more of the elements C, N and O are present, $Me_{e1}$, and $Me_{e2}$ being different elements, the atomic fraction of $Me_{e1}$ to $Me_{e2}$ being 0 to about 0.3 and where $Me_{e1}$ is one or more of the elements in the transition metal group IV-VI, Al and Si and $Me_{e2}$ is one of the elements in the transition metal group IV-VI and Y having a thickness of from about 0.1 to about 1.0 μm, where the thickness of the layer, e, is less than about 0.5 times, the thickness of thinnest of the first layer, c, and the second layer, d, and where the layer, e, has a composition differing from the first layer, c, and the second layer, d.

DETAILED DESCRIPTION OF THE PREFERRED EMBODIMENTS

Figure 1:
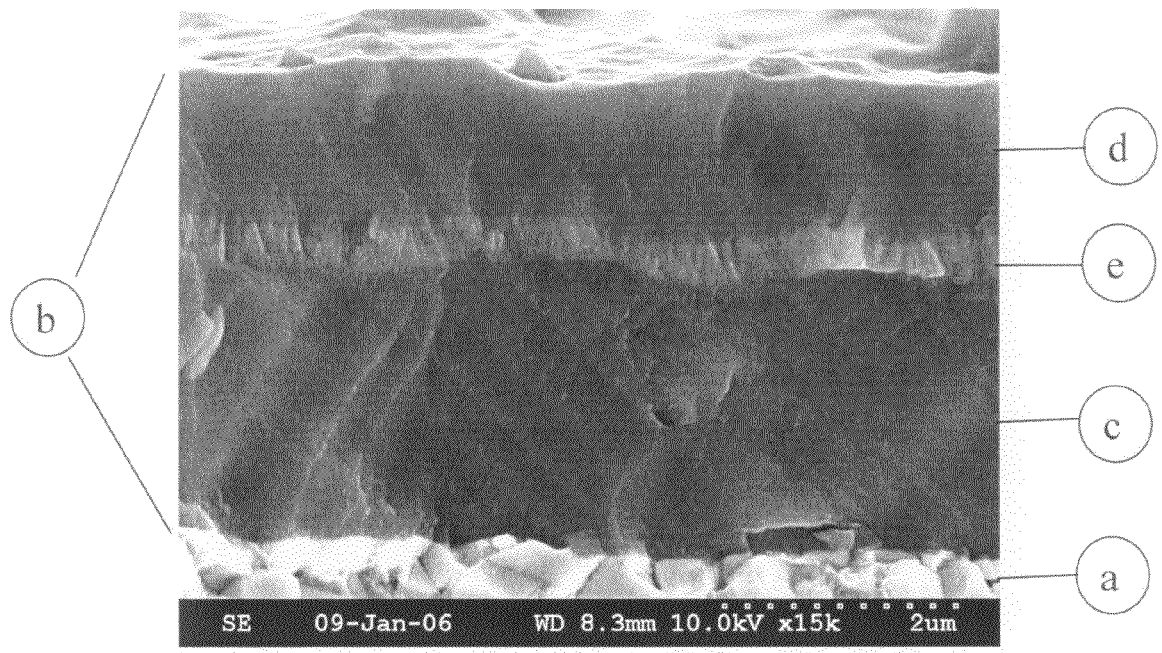
FIG. 1 and FIG. 2 show Scanning Electron Microscope (SEM) micrographs of a fracture section of exemplary coated cutting tools according to the invention in which a—cemented carbide body
    b—coating
    c—first layer
    d—second layer
    e—sandwiched layer in between c and d.
    d'—second layer
    e'—sandwiched layer in between d and d'.

It has surprisingly been found that for a cutting tool with a PVD coating comprising a first layer of metal nitride, metal carbonitride, metal oxide or metal carbooxynitride, a second layer of metal nitride or metal carbonitride, between which a metal nitride, metal carbonitride, metal oxide or metal carbooxynitride layer is sandwiched, where the sandwiched layer is thinner than, and has a composition differing from, the first and the second layer, edge chipping is suppressed. Thus, in a given metal cutting operation the use of a harder, and thanks to that, more wear resistant body, as well as a thicker coating, without compromising the bulk toughness or cutting edge security, is made possible.

According to the present invention, there is provided a coated cutting tool for metal machining comprising a body, a, of cemented carbide or cermet onto which is applied an adherent, hard and wear resistant PVD coating, b, having a thickness of from about 2.0 to about 20 µm, preferably from about 3.0 to about 8.0 µm, said coating comprising:

a first hard and wear resistant refractory $(Me_{c1}, Me_{c2})(C,N,O)$ layer, c, where one or more of the elements C, N and O are present, $Me_{c1}$ and $Me_{c2}$ are different elements, and where $Me_{c1}$ is one or more of the elements in the transition metal groups IV-VI in the Periodic Table, Al and Si, preferably Al, Zr, V, Nb, Si and Ti, more preferably one or more of Al and Si, most preferably Al, and $Me_{c2}$ is one of the elements in the transition metal group IV-VI in the Periodic Table and Y, preferably Zr, V, Nb, Y or Ti, more preferably Zr, V, Nb or Ti, most preferably Zr or Ti, having a thickness of from about 1.0 to about 4.5 µm, preferably from about 2.0 to about 3.0 µm, a second hard and wear resistant refractory $(Me_{d1}, Me_{d2})(C,N)$ layer, d, where one or more of the elements C and N is present, $Me_{d1}$ and $Me_{d2}$ are different elements, and where $Me_{d1}$ is one or more of the elements in the transition metal groups IV-VI in the Periodic Table, Al and Si, preferably Al, Zr, V, Nb, Si and Ti, more preferably one or more of Al and Si, most preferably Al, and $Me_{d2}$ is one of the elements in the transition metal group IV-VI in the Periodic Table and Y, preferably Zr, V, Nb, Y or Ti, more preferably Zr, V, Nb or Ti, most preferably Zr or Ti, having a thickness of from about 0.5 to about 4.5 µm, preferably from about 1.0 to about 2.0 µm, and in between the first and the second layer, an $(Me_{e1}, Me_{e2})(C,N,O)$ layer, e, where $Me_{e1}$, is optionally present, and one or more of the elements C, N and O are present, $Me_{e1}$ and $Me_{e2}$ are different elements, the atomic fraction of $Me_{e1}$ to $Me_{e2}$ is from 0 to about 0.3, preferably from 0 to about 0.2, more preferably from 0 to about 0.05, most preferably 0, i.e., is an $(Me_{e2})(C,N,O)$ layer, and where $Me_{e1}$ is one or more of the elements in the transition metal groups IV-VI in the Periodic Table, Al and Si, preferably Al, Zr, V, Nb, Si and Ti, more preferably one or more of Al and Si, most preferably Al, and $Me_{e2}$ is one of the elements in the transition metal group IV-VI in the Periodic Table and Y, preferably Zr, V, Nb, Y or Ti, more preferably Zr, V, Nb or Ti, most preferably Zr or Ti, having a thickness of from about 0.1 to about 1.0 µm, preferably from about 0.1 to about 0.7 µm, where the thickness of the layer, e, is less than about 0.5 times, preferably less than about 0.3 times, most preferably less than about 0.2 times, the thickness of thinnest of the first layer, c, and the second layer, d, and where the layer, e, has a composition differing from the first layer, c, and the second layer, d, the atomic fraction of $Me_{e1}$ to $Me_{c1}$ and $Me_{d1}$, respectively, preferably being 0 to about 0.9, more preferably 0 to about 0.7, most preferably 0 to about 0.5.

In one preferred embodiment, $Me_{c1}$ and $Me_{d1}$ are the same elements.

In another preferred embodiment, $Me_{c2}$ and $Me_{d2}$ are the same elements.

In yet another preferred embodiment, $Me_{c2}$, $Me_{d2}$ and $Me_{e2}$ are the same elements.

In one preferred embodiment, the first layer, c, is an $(Me_{c1}, Me_{c2})N$ layer where $Me_{c1}$ is Al and $Me_{c2}$ is Ti, having an atomic fraction of $Me_{c1}$ to $Me_{c2}$ of from about 0.8 to about 2.0, preferably from about 1.0 to about 1.8, most preferably from about 1.3 to about 1.5, the second layer, d, is an $(Me_{d1}, Me_{d2})N$ layer where $Me_{d1}$ is Al and $Me_{d2}$ is Ti, having an atomic fraction of $Me_{d1}$ to $Me_{d2}$ of from about 1.0 to about 2.0, preferably from about 1.2 to about 1.8, most preferably from about 1.4 to about 1.6, and the layer, e, is an $(Me_{e2})N$ layer where $Me_{e2}$ is Ti.

In another preferred embodiment, first layer, c, is an $(Me_{c1}, Me_{c2})N$ layer where $Me_{c1}$ is Si and $Me_{c2}$ is Ti, having an atomic fraction of $Me_{c1}$ to $Me_{c2}$ of from about 0.02 to about 0.40, preferably from about 0.05 to about 0.20, the second layer, d, is an $(Me_{d1}, Me_{d2})N$ layer where $Me_{d1}$ is Si and $Me_{d2}$ is Ti, having an atomic fraction of $Me_{d1}$ to $Me_{d2}$ of from about 0.02 to about 0.50, preferably from about 0.05 to about 0.30, and the layer, e, is an $(Me_{e2})N$ layer where $Me_{e2}$ is Ti.

In another preferred embodiment, the first layer, c, is an $(Me_{c1}, Me_{c2})N$ layer where $Me_{c1}$ is AlSi and $Me_{c2}$ is Ti, having an atomic fraction of $Me_{c1}$ to $Me_{c2}$ of from about 0.8 to about 2.0, preferably from about 1.0 to about 1.8, most preferably from about 1.2 to about 1.5, second layer, d, is an $(Me_{d1}, Me_{d2})N$ layer where $Me_{d1}$ is AlSi and $Me_{d2}$ is Ti, having an atomic fraction of $Me_{d1}$ to $Me_{d2}$ of from about 1.0 to about 2.0, preferably from about 1.2 to about 1.8, most preferably from about 1.4 to about 1.6 and the layer, e, is an $(Me_{e2})N$ layer where $Me_{e2}$ is Ti. In this embodiment, both the first and the second layer can be referred to as $(Al_y Si_z Ti_{1-y-z})N$, where 0.45 less than or equal to y+z less than or equal to 0.67 and z less than or equal to 0.10.

In another embodiment, the coating further comprises additional sequences comprising first and/or second layers between which there is a layer e between the first and second layers c and d such that adjacent to any first or second layer is a layer e' between the first and second layers c and d'.

In another embodiment, the body has, in addition, a from about 0.05 to about 1.0 µm thick precoating of an Me(C,N,O) layer, where Me preferably is Ti.

In another embodiment, the body is coated with additional outer layers, with a total thickness of from about 0.05 to about 1.0 µm, for improving the wear resistance, for cosmetic appearance or for wear detection purposes, e.g., an outermost coating of Me(C,N,O) where one or more of C, N and O are present, preferably Me(C,N), where Me preferably is Ti.

In another embodiment, the crystal structures of the first layer and the second layer both comprise crystallites of fcc cubic structure, preferably cubic rock salt structure with a grain size less than about 50 nm, preferably less than about 40 nm. The layer, e, has a crystallite grain size larger than about 40 nm, preferably larger than about 50 nm, perpendicular to the growth direction and larger than about 100 nm parallel to the growth direction, i.e., having columnar growth, and most preferably extending in the growth direction throughout its thickness, and having a crystal structure comprising crystallites of cubic structure.

Surprisingly, it has been found that a particular improvement of tool properties is obtained for specific combination layer thickness and compositions, for which combinations the sandwiched layer between the first and second layer has an unexpectedly low value of residual stress.

In one embodiment, the layer, e, has a residual stress of an absolute value less than about 600 MPa, i.e., being compressive or tensile, preferably less than about 300 MPa, more preferably less than about 120 MPa.

In a further embodiment, the second layer, d, has a residual compressive stress more than about 1000 MPa, preferably from about 1800 to about 3500 MPa.

In a further embodiment, the first layer, c, and second layer, d, have a residual compressive stress more than about 1000 MPa, preferably from about 1800 to about 3500 MPa.

In a further embodiment, the second layer, d, has a residual compressive stress more than about 1000 MPa, preferably from about 1800 to about 3500 MPa, and the layer, e, has a residual stress of an absolute value less than about 600 MPa, i.e., being compressive or tensile, preferably less than about 300 MPa, more preferably less than about 120 MPa.

In yet a further embodiment, the first layer, c, and second layer, d, have a residual compressive stress more than about 1000 MPa, preferably from about 1800 to 3500 about MPa, and the layer, e, has a residual stress of an absolute value less than about 600 MPa, i.e., being compressive or tensile, preferably less than about 300 MPa, more preferably less than about 120 MPa.

In one preferred embodiment, said cutting tool is a cutting tool insert for turning, milling or drilling.

In another preferred embodiment, said cutting tool is a solid cemented carbide drill or endmill.

According to the invention there is also provided a method of producing a coated cutting tool comprising providing a body of cemented carbide or cermet onto which is deposited, by PVD technique as known in the art, a hard and wear resistant from about 2.0 to about 20 µm, preferably from about 3.0 to about 8.0 µm, thick coating comprising:

a first hard and wear resistant refractory $(Me_{c1},Me_{c2})(C,N,O)$ layer, c, where one or more of the elements C, N and O are present, $Me_{c1}$ and $Me_{c2}$ are different elements, and where $Me_{c1}$ is one or more of the elements in the transition metal group IV-VI in the Periodic Table, Al and Si, preferably Al, Zr, V, Nb, Si and Ti, more preferably one or more of Al and Si, most preferably Al, and $Me_{c2}$ is one of the elements in the transition metal group IV-VI in the Periodic Table and Y, preferably Zr, V, Nb, Y or Ti, more preferably Zr, V, Nb or Ti, most preferably Zr or Ti, having a thickness of from about 1.0 to about 4.5 µm, preferably from about 2.0 to about 3.0 µm, a second hard and wear resistant refractory $(Me_{d1},Me_{d2})$ (C,N) layer, d, where one or more of the elements C and N are present, $Me_{d1}$ and $Me_{d2}$ are different elements, and where $Me_{d1}$ is one or more of the elements in the transition metal group IV-VI in the Periodic Table, Al and Si, preferably Al, Zr, V, Nb, Si and Ti, more preferably one or more of Al and Si, most preferably Al, and $Me_{c2}$ is one of the elements in the transition metal group IV-VI in the Periodic Table, and Y, preferably Zr, V, Nb, Y or Ti, more preferably Zr, V, Nb or Ti, most preferably Zr or Ti, having a thickness of from about 0.5 to about 4.5 µm, preferably from about 1.0 to about 2.0 µm, and in between the first layer, c, and the second layer, d, an $(Me_{e1}, Me_{e2})(C,N,O)$ layer, e, where $Me_{e1}$ is optionally present, and one or more of the elements C, N and O are present, $Me_{e1}$ and $Me_{e2}$ are different elements, the atomic fraction of $Me_{e1}$ to $Me_{e2}$ is 0 to about 0.3, preferably 0 to about 0.2, more preferably 0 to about 0.05, most preferably 0, i.e., is an $(Me_{e2})(C,N,O)$ layer, and where $Me_{e1}$ is one or more of the elements in the transition metal group IV-VI in the Periodic Table, Al and Si, preferably Al, Zr, V, Nb, Si and Ti, more preferably one or more of Al and Si, most preferably Al, and $Me_{e2}$ is one of the elements in the transition metal group IV-VI in the Periodic Table and Y, preferably Zr, V, Nb, Y or Ti, more preferably Zr, V, Nb or Ti, most preferably Zr or Ti, having a thickness of from about 0.1 to about 1.0 µm, preferably from about 0.1 to about 0.7 µm, where the thickness of the layer, e, is less than about 0.5 times, preferably about 0.3 times, most preferably less than about 0.2 times, the thickness of thinnest of the first layer, c, and the second layer, d, and where the layer, e, has a composition differing from the first layer, c, and the second layer, d, the atomic fraction of $Me_{e1}$ to $Me_{c1}$ and $Me_{d1}$, respectively, preferably being 0 to about 0.9, more preferably 0 to about 0.7, most preferably 0 to about 0.5.

In a preferred embodiment, the bodies are subjected to a PVD coating process in a coater using reactive arc evaporation type PVD equipment containing metal evaporation $Me_{c1}+Me_{c2}$, $Me_{d1}+Me_{d2}$, $Me_{e1}+Me_{e2}$ sources with suitable composition to obtain the desired metal atomic ratios, arranged such to coat the full charge homogeneously. The sources can, e.g., be three single targets arranged so that each target coats the full charge homogeneously or, as an alternative, six sources can be arranged pairwise so that each pair coats the full charge homogeneously. The coater is evacuated, followed by the steps of heating and plasma etching in order to further clean the tools, and to condition their surfaces by removing excess binder phase from the body surface. By metal evaporation whilst maintaining a partial pressure of reactive gas, said gas being an appropriate choice, depending on whether a nitride, carbonitride, oxide or carbooxynitride layer is deposited, of pure nitrogen, hydrocarbon, oxygen, or mixtures thereof, in the coater, and using the appropriate selection of active evaporation sources and rates the following layers are deposited:

said first $(Me_{c1},Me_{c2})(C,N,O)$ layer, c, is deposited with process parameters: arc current from about 50 to about 200 A, preferably from about 120 to about 160 A, in the equipment used, reactive gas pressure from about 3 to about 50 µbar, preferably from about 5 to about 32 µbar, and deposition temperature from about 400 to about 700° C., preferably from about 550 to about 650° C., and a substrate bias of from about −150 to about −300 V, preferably from about −170 to about −230 V, said second $(Me_{d1},Me_{d2})(C,N)$ layer, d, is deposited with process parameters: arc current from about 50 to about 200 A, preferably from about 120 to about 160 A, in the equipment used, reactive gas pressure from about 3 to about 50 µbar, preferably from about 5 to about 32 µbar, and deposition temperature from about 400 to about 700° C., preferably from about 550 to about 650° C., and a substrate bias of from about −50 to about −140 V, preferably from about −80 to about −120 V, and said $(Me_{e1}, Me_{e2})(C,N,O)$ layer, e, is deposited with process parameters: arc current from about 80 to about 210 A, in the equipment used, reactive gas pressure from about 5 to about 50 µbar, preferably from about 15 to about 35 µbar, preferably from about 140 to about 190 A temperature from about 400 to about 700° C., preferably from about 550 to about 650° C., and the substrate bias from about −30 to about −150 V, preferably from about −70 to about −120 V.

In case the deposited coatings are electrically insulating to the extent that problems arise in operating the process, pulsed power operation of the arc sources would be employed. Furthermore, in such case of insulating coatings on the substrates, pulsed power operation of substrate bias would be applied. The coating can also be deposited by other PVD technologies, such as, magnetron sputtering, dual magnetron sputtering, or pulsed-, or high impulse power pulsed, -magnetron sputtering, or combinations thereof.

The invention is additionally illustrated in connection with the following examples, which are to be considered as illustrative of the present invention. It should be understood, however, that the invention is not limited to the specific details of the examples.

Example 1

Uncoated cutting tools, WC-10% Co inserts of the ISO-type CNMG120408 for turning were cleaned and subjected to a PVD coating process according to the following. The inserts were loaded into a reactive arc evaporation type PVD equipment chamber containing six metal evaporation sources, arranged pairwise. The inserts were further subjected to a three-fold rotation in order to coat them homogeneously. One pair of evaporators had Ti metal targets and the other two pairs had AlTi alloy targets having a composition atomic ratio Al/Ti of 2. The chamber was evacuated, followed by the steps of heating and plasma etching in order to further clean the tools, and to condition their surfaces by removing excess binder phase from the insert surface. By metal evaporation whilst maintaining a partial pressure of nitrogen in the coater, and using the appropriate selection of active evaporation sources and rates TiN and (Ti,Al)N alloy layers were deposited at a temperature of 600° C. The process conditions during the deposition steps were as below:

TABLE 1

| Layer | Target | Time [min] | Arc current [A] | Bias [V] | Pressure [μbar] |
|---|---|---|---|---|---|
| c | 4xAlTi | 130 | 140 | −200 | 10 |
| e | 2xTi | 25 | 170 | −100 | 30 |
| d | 4xAlTi | 65 | 140 | −100 | 10 |

The so manufactured and coated inserts were analyzed metallographically. Cross sections were prepared by cutting the inserts, followed by mechanical grinding and polishing by diamond grit. The coating thicknesses indicated in Table 2 were measured on the clearance side of the insert, more than 0.2 mm away, and less than 1.0 mm, from the cutting edge.

A fracture section of the coating and substrate is shown in the SEM micrograph in FIG. 1.

X-ray diffraction technique, more specifically the $\sin^2\Psi$ method (I. C. Noyan, J. B. Cohen, Residual Stress Measurement by Diffraction and Interpretation, Springer-Verlag, New York, 1987 (pp 117-130)), was used for determining the residual stress in the three layers. The results are reported in Table 2.

Thin film Transmission Electron Microscopy (Oxford Instruments, Link ISIS) equipped with an EDS spectrometer was used to determine the Al/Ti atomic ratio as an average of four point analyses and grain size in the three layers, see Table 2.

TABLE 2

| Layer | Coating type | Thickness [μm] | Al/Ti atomic ratio | Grain size [nm] | Residual stress [MPa] |
|---|---|---|---|---|---|
| c | (Ti,Al)N | 2.4 | 1.34 | 35 | −2400* |
| e | TiN | 0.2 | 0 | columnar 75 × 150 | −80 |
| d | (Ti,Al)N | 1.6 | 1.56 | 30 | −2300 |

*Estimated from a measurement of a single layer coating deposited under the same conditions and having the same composition and thickness as layer c. The residual stress of layer c is expected to remain on approximately the same stress level after deposition of layer, e, and, d.

Example 2

Inserts from Example 1 were subjected to a coating process using the parameters according to Table 3 depositing a further sandwiched and second type layer.

TABLE 3

| Layer | Target | Time [min] | Arc current [A] | Bias [V] | Pressure [μbar] |
|---|---|---|---|---|---|
| c | 4xAlTi | 130 | 140 | −200 | 10 |
| e | 2xTi | 25 | 170 | −100 | 30 |
| d | 4xAlTi | 65 | 140 | −150 | 10 |
| e' | 2xTi | 25 | 170 | −100 | 30 |
| d' | 4xAlTi | 65 | 140 | −100 | 10 |

Figure 2:
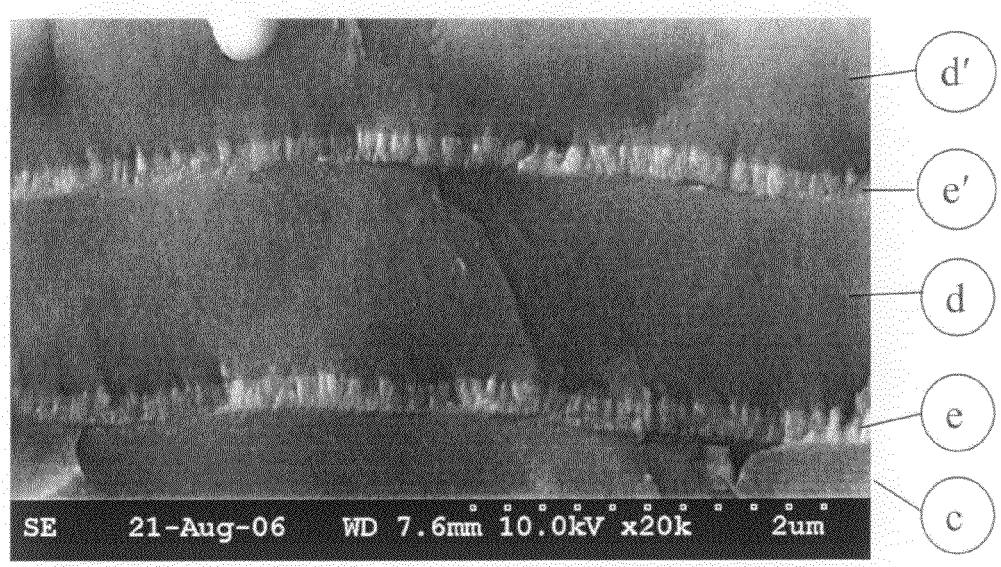

A fracture section of the coating is shown in the SEM micrograph in FIG. 2.

The inserts were analyzed using the same technique as in Example 1. The results are displayed in Table 4.

TABLE 4

| Layer | Coating type | Thickness [μm] | Al/Ti atomic ratio | Grain size [nm] | Residual stress [MPa] |
|---|---|---|---|---|---|
| c | (Ti,Al)N | 2.4 | 1.34 | 35 | −2400* |
| e | TiN | 0.2 | 0 | columnar 75 × 150 | −100* |
| d | (Ti,Al)N | 1.6 | 1.56 | 30 | −2100* |
| e' | TiN | 0.2 | 0 | columnar 75 × 150 | −80 |
| d' | (Ti,Al)N | 1.6 | 1.56 | 30 | −2300 |

*Estimated from a measurement of a single layer coating deposited under the same conditions and having a composition and thickness according to the layer in question. The residual stress of the layer is expected to remain on about the same stress level after deposition of layers e and d.

Example 3

A coating, according to Example 1, was deposited to a thickness of 4.2 μm on solid carbide ball nosed endmills of diameter 10 mm. Similar endmills of the same cemented carbide composition were coated by a prior art (Ti,Al)N single layer coating, having an atomic fraction of Al to Ti of 2.0 and a thickness of 2.9 μm. These two endmill variants were evaluated in a dry milling machining test, copymilling a 1.2379 steel of hardness HRC 58. The cutting speed was 170 m/min, at a feed rate of 0.12 mm/tooth, and engagement $a_p=a_e=0.2$ mm. The tool lives, in m of milled distance, until a maximum wear of 0.40 mm was attained are presented in Table 5. The results indicate that the invented coating has a superior performance in the extremely demanding milling of very hard steels.

TABLE 5

| Test of coated solid carbide endmills | commercial coating | coating according to invention |
|---|---|---|
| tool life test 1 (m) | 250 | 500 |
| tool life test 2 (m) | 250 | 350 |
| average tool life (m) | 250 | 425 |

Example 4

Endmills according to Example 3 were subjected to a further test: machining of two identical tools for die and mould applications. In this application, edge security and toughness is essential. By experience it is perilous to extend the thickness of prior art coatings, such as the one described in Example 3, beyond 3.0 μm, by reason of increased risk of edge chipping and tool bulk fracture that may follow suit.

| Type of test Finishing of mould using diameter 6 mm ball nosed endmill | |
| --- | --- |
| Tool demand | >296 min life time, completion of one part |
| Work piece | Uddeholm Orvar Supreme, HRC 51 |
| Cutting speed, rpm | 12500 rpm |
| Tooth feed, $f_z$, mm/edge | 0.08 mm |
| Engagement, $a_p/a_e$, mm | 0.07/0.1 mm |
| Cooling | dry |

The result of this test was that the commercial grade tool failed to meet the demanded tool life, due to cutting edge brittleness, whereas the invented tool finished the operation with very little wear or damage to the cutting edge. This result clearly exhibits the superior wear resistance of the invented tool as well as ability to better sustain an integer cutting edge compared to the commercial grade tool. This test, furthermore, represents a vital customer value: to be able to machine a complete part without tool change.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A coated cutting tool for metal machining comprising a body of cemented carbide or cermet onto which is applied
   a PVD coating wherein said coating has a thickness of from about 2.0 to about 20 µm, and comprises:
   a first $(Me_{c1},Me_{c2})(C,N,O)$ layer, c, where one or more of the elements C, N and O are present, $Me_{c1}$ and $Me_{c2}$ being different elements, and where $Me_{c1}$ is one or more of the elements in the transition metal group IV-VI, Al and Si and $Me_{c2}$ is one of the elements in the transition metal group IV-VI and Y having a thickness of from about 1.0 to about 4.5 µm,
   a second $(Me_{d1},Me_{d2})(C,N)$ layer, d, where one or more of the elements C and N are present, $Me_{d1}$ and $Me_{d2}$ being different elements, and where $Me_{d1}$ is one or more of the elements Al, Zr, V, Nb, Si or Ti and $Me_{d2}$ is one of the elements Zr, V, Nb, Y or Ti and Y having a thickness of from about 0.5 to about 4.5 µm and
   in between the first layer, c, and the second layer, d, an $(Me_{e1}, Me_{e2})(C,N,O)$ layer, e, where $Me_{e1}$ is optionally present and one or more of the elements C, N and O are present, $Me_{e1}$ and $Me_{e2}$ are different elements, the atomic fraction of $Me_{e1}$ to $Me_{e2}$ is 0 to about 0.3 and where $Me_{e1}$ is one or more of the elements in the transition metal group IV-VI, Al and Si and $Me_{e2}$ is one of the elements in the transition metal group IV-VI and Y having a thickness of from about 0.1 to about 1.0 µm,
   where the thickness of the layer, e, between the first layer, c, and the second layers, d, is less than about 0.5 times the thickness of thinnest of the first layer, c, and the second layer, d,
   where the layer, e, between the first layer, c, and the second layer, d, has a composition differing from the first layer, c, and the second layer, d, and
   wherein the first layer, c, is in direct contact with the layer, e, and the layer, e, is in direct contact with the second layer, d.

2. The coated cutting tool of claim 1 wherein the layer, e, between the first layer, c, and second layer, d, is less than about 0.3 times the thickness of thinnest of the first layer, c, and the second layer, d.

3. The coated cutting tool of claim 1 wherein the layer, e, between the first layer, c, and second layer, d, is less than about 0.2 times the thickness of thinnest of the first layer, c, and the second layer, d.

4. The coated cutting tool of claim 1 wherein the atomic fraction of $Me_{e1}$ to $Me_{c1}$ and $Me_{d1}$, respectively, is 0 to about 0.9.

5. The coated cutting tool of claim 1 wherein the first layer, c, is an $(Me_{c1},Me_{c2})N$ layer where $Me_{c1}$ is Al and $Me_{c2}$ is Ti, having an atomic fraction of $Me_{c1}$ to $Me_{c2}$ of from about 0.8 to about 2.0, the second layer, d, is an $(Me_{d1},Me_{d2})N$ layer where $Me_{d1}$ is Al and $Me_{d2}$ is Ti, having an atomic fraction of $Me_{d1}$ to $Me_{d2}$ of from about 1.0 to about 2.0, and the layer, e, between the first layer, c, and second layer, d, is an $(Me_{e2})N$ layer where $Me_{e2}$ is Ti.

6. The coated cutting tool of claim 1 wherein the first layer, c, is an $(Me_{c1},Me_{c2})N$ layer where $Me_{c1}$ is Si and $Me_{c2}$ is Ti, having an atomic fraction of $Me_{c1}$ to $Me_{c2}$ of from about 0.02 to about 0.40, the second layer, d, is an $(Me_{d1},Me_{d2})N$ layer where $Me_{d1}$ is Si and $Me_{d2}$ is Ti, having an atomic fraction of $Me_{d1}$ to $Me_{d2}$ of from about 0.02 to about 0.50 and the layer, e, between the first layer, c, and second layer, d, is an $(Me_{e2})N$ layer where $Me_{e2}$ is Ti.

7. The coated cutting tool of claim 1 wherein the first layer, c, is an $(Me_{c1},Me_{c2})N$ layer where $Me_{c1}$ is AlSi and $Me_{c2}$ is Ti, having an atomic fraction of $Me_{c1}$ to $Me_{c2}$ of from about 0.8 to about 2.0, the second layer, d, is an $(Me_{d1},Me_{d2})N$ layer where $Me_{d1}$ is AlSi and $Me_{d2}$ is Ti, having an atomic fraction of $Me_{d1}$ to $Me_{d2}$ of from about 1.0 to about 2.0, and the layer, e, between the first layer, c, and second layer, d, is an $(Me_{e2})N$ layer where $Me_{e2}$ is Ti.

8. The coated cutting tool of claim 1 wherein the layer, e, between the first layer, c, and second layer, d, has a residual stress, either compressive or tensile, of an absolute value less than about 600 MPa.

9. The coated cutting tool of claim 8 wherein the second layer, d, has a residual compressive stress more than about 1000 MPa.

10. The coated cutting tool of claim 1 wherein the coating further comprises additional sequences comprising first and/or second layers between which there is a layer between the first and second layers such that adjacent to any first or second layer is a layer between the first and second layers.

11. The coated cutting tool of claim 1 wherein the in said first layer, c, $Me_{c1}$ is Al, Zr, V, Nb, Si or Ti, $Me_{c2}$ is Zr, V, Nb, Y or Ti and said layer has a thickness of from about 2.0 to about 3.0 µm, in said second layer, d, $Me_{d1}$ is Al, Zr, V, Nb, Si or Ti, $Me_{d2}$ is Zr, V, Nb, Y or Ti and said layer has a thickness of from about 1.0 to about 2.0 µm; in said layer, e, the atomic fraction of $Me_{e1}$ to $Me_{e2}$ is from 0 to about 2, $Me_{e1}$ is Al, Zr, V, Nb, Si or Ti, $Me_{e2}$ is Zr, V, Nb, Y or Ti and said layer has a thickness of from about 0.1 to about 0.7 µm.

12. The coated cutting tool of claim 11 wherein in said first layer, c, $Me_{c1}$ is one or more of Al and Si, and $Me_{c2}$ is Zr or Ti, in said second layer, d, $Me_{d1}$ is one or more of Al or Si and $Me_{d2}$ is Zr, V, Nb, or Ti, in said layer, e, the atomic fraction of $Me_{e1}$ to $Me_{e2}$ is from 0 to about 0.05, $Me_{c1}$ is one or more of Al and Si and $Me_{c2}$ is Zr, V, Nb or Ti.

13. The coated cutting tool of claim 12 wherein in said first layer, c, $Me_{c1}$ is one or more of Al and Si, and $Me_{c2}$ is Zr or Ti, in said second layer, d, $Me_{d1}$ is one or more of Al or Si and $Me_{d2}$ is Zr, V, Nb, or Ti, in said layer, e, the atomic fraction of $Me_{e1}$ to $Me_{e2}$ is from 0 to about 0.05, $Me_{e1}$ is one or more of Al and Si and $Me_{e2}$ is Zr or Ti.

14. The coated cutting tool of claim 4 wherein the atomic ratio of $Me_{e1}$ to $Me_{c1}$ and $Me_{d1}$ is from 0 to about 0.7.

15. The coated cutting tool of claim 4 wherein the atomic ratio of $Me_{e1}$ to $Me_{c1}$ and $Me_{d1}$ is from 0 to about 0.5.

16. The coated cutting tool of claim 5 wherein the first layer, c, has an atomic fraction of $Me_{c1}$ to $Me_{c2}$ of from about 1.0 to about 1.8 and said second layer, d, has an atomic fraction of $Me_{d1}$ to $Me_{d2}$ of from about 1.2 to about 1.8.

17. A coated cutting tool for metal machining comprising a body of cemented carbide or cermet onto which is applied a PVD coating wherein said coating has a thickness of from about 2.0 to about 20 μm, and comprises:
 a first $(Me_{c1},Me_{c2})(C,N,O)$ layer, c, where one or more of the elements C, N and O are present, $Me_{c1}$ and $Me_{c2}$ being different elements, and where $Me_{c1}$ is one or more of the elements in the transition metal group IV-VI, Al and Si and $Me_{c2}$ is one of the elements in the transition metal group IV-VI and Y having a thickness of from about 1.0 to about 4.5 μm,
 a second $(Me_{d1},Me_{d2})(C,N)$ layer, d, where one or more of the elements C and N are present, $Me_{d1}$ and $Me_{d2}$ being different elements, and where $Me_{d1}$ is one or more of the elements Al, Zr, V, Nb, Si or Ti and $Me_{d2}$ is one of the elements Zr, V, Nb, Y or Ti and Y having a thickness of from about 0.5 to about 4.5 μm and
 in between the first layer, c, and the second layer, d, an $(Me_{e1}, Me_{e2})(C,N,O)$ layer, e, where $Me_{e1}$ is optionally present and one or more of the elements C, N and O are present, $Me_{e1}$ and $Me_{e2}$ are different elements, the atomic fraction of $Me_{e1}$ to $Me_{e2}$ is 0 to about 0.3 and where $Me_{e1}$ is one or more of the elements in the transition metal group IV-VI, Al and Si and $Me_{e2}$ is one of the elements in the transition metal group IV-VI and Y having a thickness of from about 0.1 to about 1.0 μm,
 where the thickness of the layer, e, between the first layer, c, and the second layers, d, is less than about 0.5 times the thickness of thinnest of the first layer, c, and the second layer, d,
 where the layer, e, between the first layer, c, and the second layer, d, has a composition differing from the first layer, c, and the second layer, d,
 wherein the first layer, c, is in direct contact with the layer, e, and the layer, e, is in direct contact with the second layer, d,
 wherein the first layer, c, is an $(Me_{c1},Me_{c2})N$ layer where $Me_{c1}$ is Si and $Me_{c2}$ is Ti, having an atomic fraction of $Me_{c1}$ to $Me_{c2}$ of from about 0.02 to about 0.40, the second layer, d, is an $(Me_{d1},Me_{d2})N$ layer where $Me_{d1}$ is Si and $Me_{d2}$ is Ti, having an atomic fraction of $Me_{d1}$ to $Me_{d2}$ of from about 0.02 to about 0.50 and the layer, e, between the first layer, c, and second layer, d, is an $(Me_{e2})N$ layer where $Me_{e2}$ is Ti, and
 wherein the first layer, c, has an atomic fraction of $Me_{c1}$ to $Me_{c2}$ of from about 0.50 to about 0.70 and said second layer, d, has an atomic fraction of $Me_{d1}$ to $Me_{d2}$ of from about 0.05 to about 0.30.

18. The coated cutting tool of claim 7 wherein the first layer, c, has an atomic fraction of $Me_{c1}$ to $Me_{c2}$ of from about 1.0 to about 1.8 and said second layer, d, has an atomic fraction of $Me_{d1}$ to $Me_{d2}$ of from about 1.2 to about 1.8.

19. The coated cutting tool of claim 8 wherein the layer, e, has a residual stress less than about 300 MPa.

20. The coated cutting tool of claim 9 wherein the second layer, d, has a compressive residual stress from about 1800 to about 3500 MPa.

* * * * *